Figure 1:
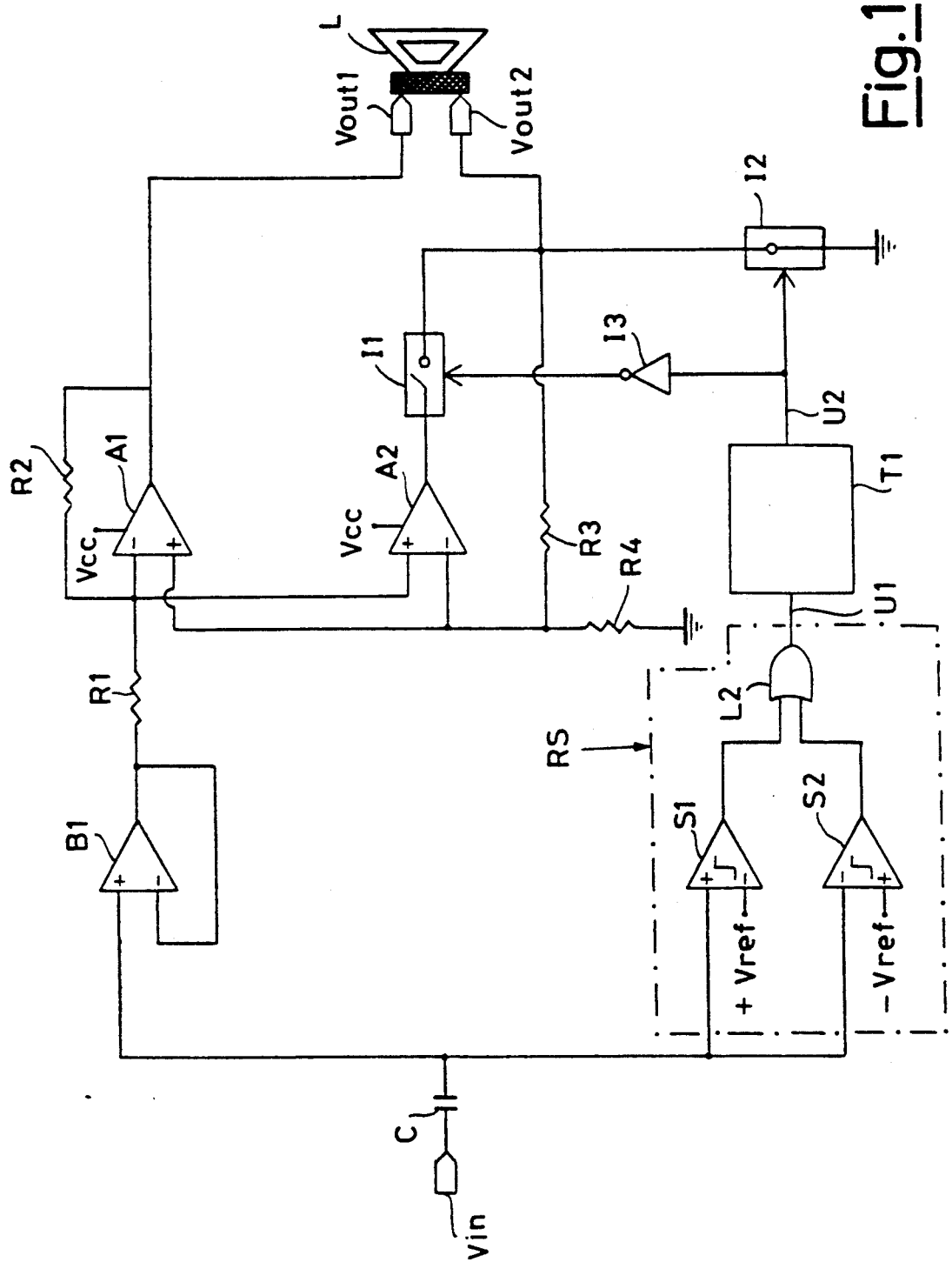

United States Patent
Brambilla et al.

[11] Patent Number: 5,194,821
[45] Date of Patent: Mar. 16, 1993

[54] HIGH EFFICIENCY POWER AUDIO AMPLIFIERS COMPRISING TWO AMPLIFIER WITH A SINGLE FEED

[75] Inventors: Davide Brambilla, Milan; Guido Brasca, Varese; Edoardo Botti, Vigevano, all of Italy

[73] Assignee: SGS-Thomson Microelectronics s.r.l., Milan, Italy

[21] Appl. No.: 793,628

[22] Filed: Nov. 18, 1991

[30] Foreign Application Priority Data
Nov. 20, 1990 [IT] Italy .................... 22114 A/90

[51] Int. Cl.[5] .................................................. H03F 1/14
[52] U.S. Cl. .................................... 330/51; 381/120
[58] Field of Search ............... 330/51, 124 D, 124 R, 330/136, 280, 301; 381/120, 121

[56] References Cited
U.S. PATENT DOCUMENTS

| | | | |
|---|---|---|---|
| 3,881,058 | 4/1975 | Klauck | 381/120 |
| 4,330,756 | 5/1982 | Moreau | 330/297 |
| 4,433,306 | 2/1984 | Honda et al. | 330/297 |
| 4,517,528 | 5/1985 | Tanaka et al. | 330/297 |

*Primary Examiner*—Steven Mottola
*Attorney, Agent, or Firm*—Seed and Berry

[57] ABSTRACT

The amplifier comprises a first and a second amplifier block of opposite phase driven by a single input signal and having its outputs connected to the two terminals of a load. It also comprises circuit means to disable one of the said amplifier blocks when the absolute value of the input signal is less than a predetermined threshold level. A passive feedback system capable of maintaining the amplifier gain constant is located between the aforesaid terminals of the load and the inputs to the two amplifier blocks.

18 Claims, 5 Drawing Sheets

HIGH EFFICIENCY POWER AUDIO AMPLIFIERS COMPRISING TWO AMPLIFIER WITH A SINGLE FEED

This invention relates to a high efficiency power audio amplifier comprising two amplifiers with a single feed.

Audio signals are frequently amplified using a pair of power amplifier blocks, normally of class A-B, caused to operate in a bridge configuration, or with the load governed by corresponding signals of opposite phase. The output curve from this type of amplifier for a sinusoidal signal starts from 0% in the absence of output power and reaches 70% under the conditions of maximum output power.

It is also known that power amplifiers of the switch type in class D can be used to obtain greater output and thus lower consumption for equal power delivered. These have the advantage of very high efficiency, equal to approximately 95%, but often give rise to distortion problems, and are also rather complex with circuitry outside the device.

As an alternative to these, amplifiers in class G can be used. In these amplifiers a normal final stage of class A-B is fed by two feed voltages which are switched depending on the amplitude of the output signal.

For low power levels these provide a good increase in efficiency in comparison with a traditional amplifier. This applies in particular for musical input signals, which, substantially having an amplitude distribution of the gaussian type, allow the system to effectively double efficiency in comparison with a traditional class A-B amplifier.

The disadvantage of these class G amplifiers lies in the fact that they require more than one feed circuit.

As an alternative, as described in greater detail in Italian patent application No. 22228 A/89 lodged on the Oct. 31, 1989 in the name of the applicant, there is the possibility of simulating class G by using a pair of class A-B amplifier blocks which are switched from single-ended to bridge and vice versa depending on the level of the input signal.

This arrangement has the main disadvantage that in order to maintain constant gain when passing from single-ended to bridge a differential feedback amplifier which is particularly fast, and therefore costly and complex, is required.

The use of such an amplifier simulating class G also provides for a large capacitance in series with the load, which eliminates the continuous component of the load in the case of single-ended operation. Its presence however introduces inevitable switching delays from single-ended to bridge and vice versa, caused by the time involved in charging and discharging. Obviously these delays have an adverse effect on the overall efficiency of the amplifier.

The object of this invention is to provide a power audio amplifier simulating class G which has a high efficiency and in which the gain in the case of single-ended operation is equal to that in bridge operation and in which no intrinsic delays occur in the output wave front of the input signal when switching from single-ended to bridge.

This object is accomplished in accordance with the invention by means of a power audio amplifier having a single feed which comprises a first and a second amplifier block of opposite phase driven by a single input signal and having their outputs connected to the two terminals of a load, and circuit means to disable one of the said amplifier blocks when the input signal is less in absolute terms than a predetermined threshold level, characterised in that a passive feedback system capable of maintaining the amplifier gain constant when operating with one or two amplifier blocks is placed between the said terminals of the load and the inputs to the first and second amplifier blocks.

The amplifier according to the invention also preferably comprises a delay block capable of delaying switching of the amplifier from functioning on two amplifier blocks to one single amplifier block, or from bridge to single-ended.

Finally provision is preferably made for a transconductance amplifier with an input connected to a common node between a series of two resistances placed in parallel with the load, the output of which is operationally connected to the said disabled amplifier block to balance the voltage on the load in bridge operation.

In this way an appreciable power on the load can be obtained with a single relatively low feed voltage and above all with low dissipated power from the device when a musical signal is present.

The efficiency of the amplifier is consequently high, and above all its gain is independent of the manner in which the amplifier operates (single-ended or bridge) and therefore independent of the level of the input signal.

An amplifier without intrinsic delays is also obtained, and the switching within it takes place on the basis of each wave front of the input signal.

Figure 2:
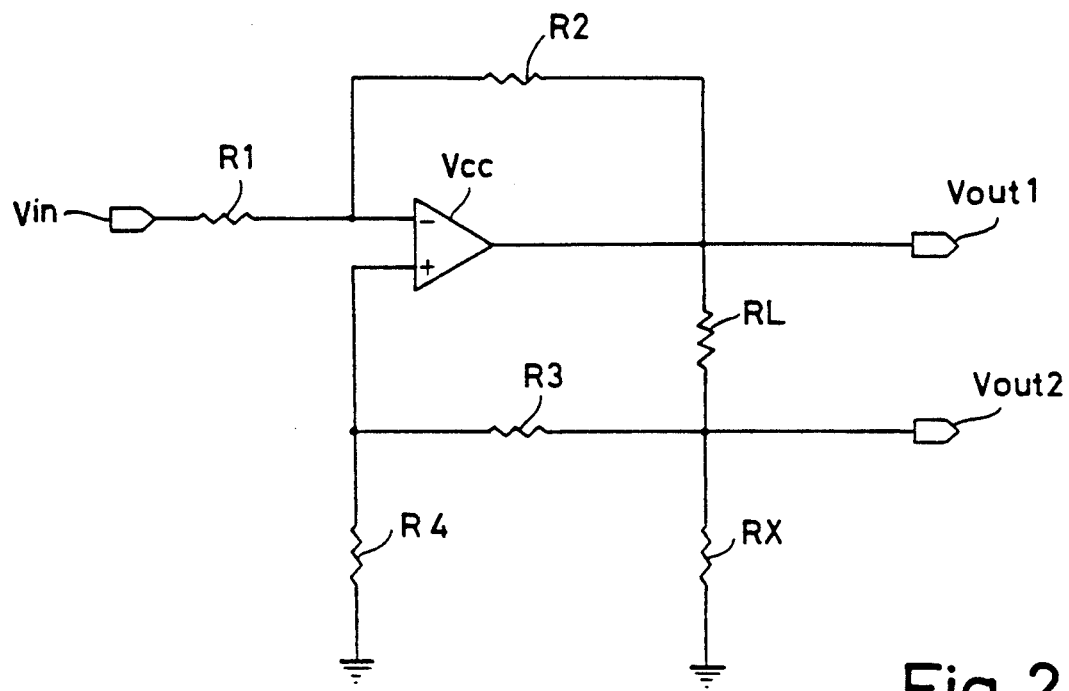
Figure 3:
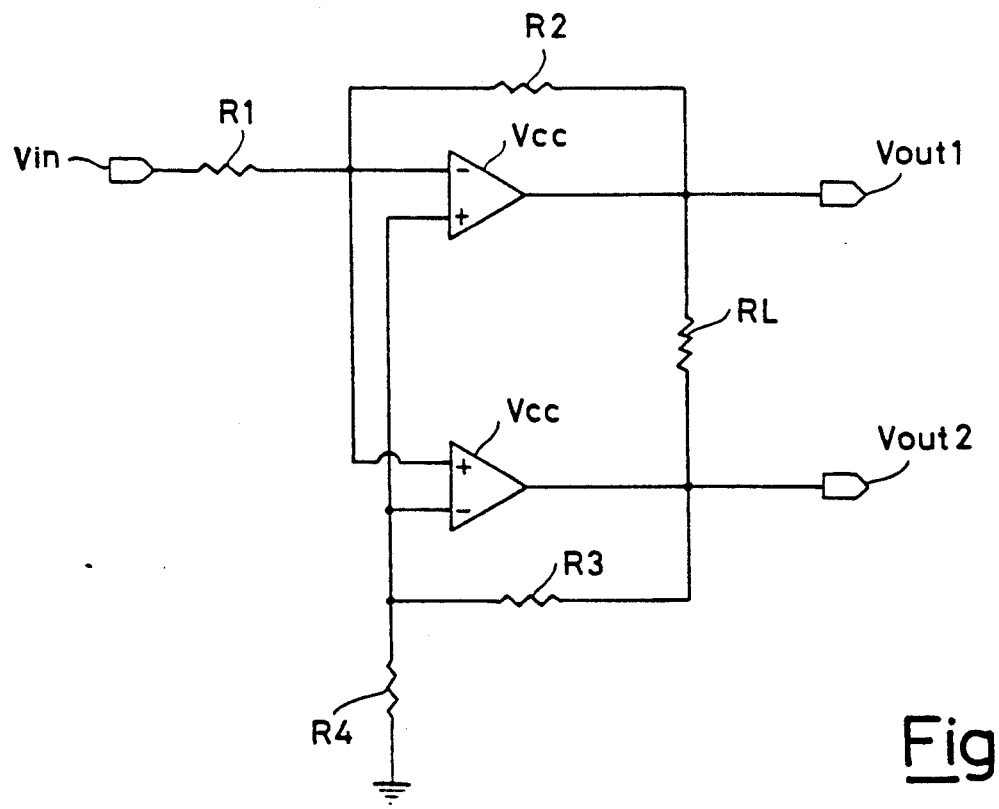
Figure 4:
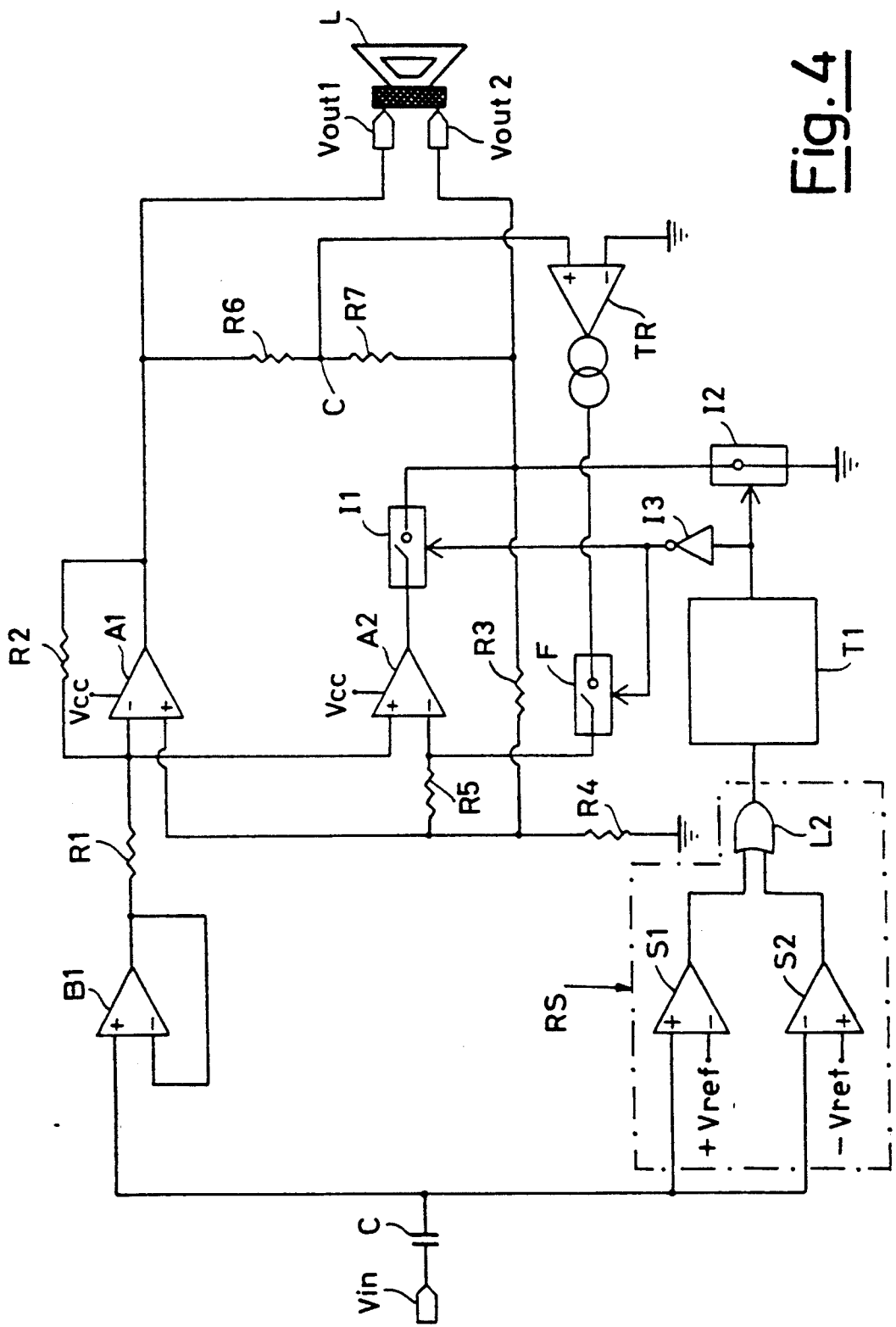
Figure 5:
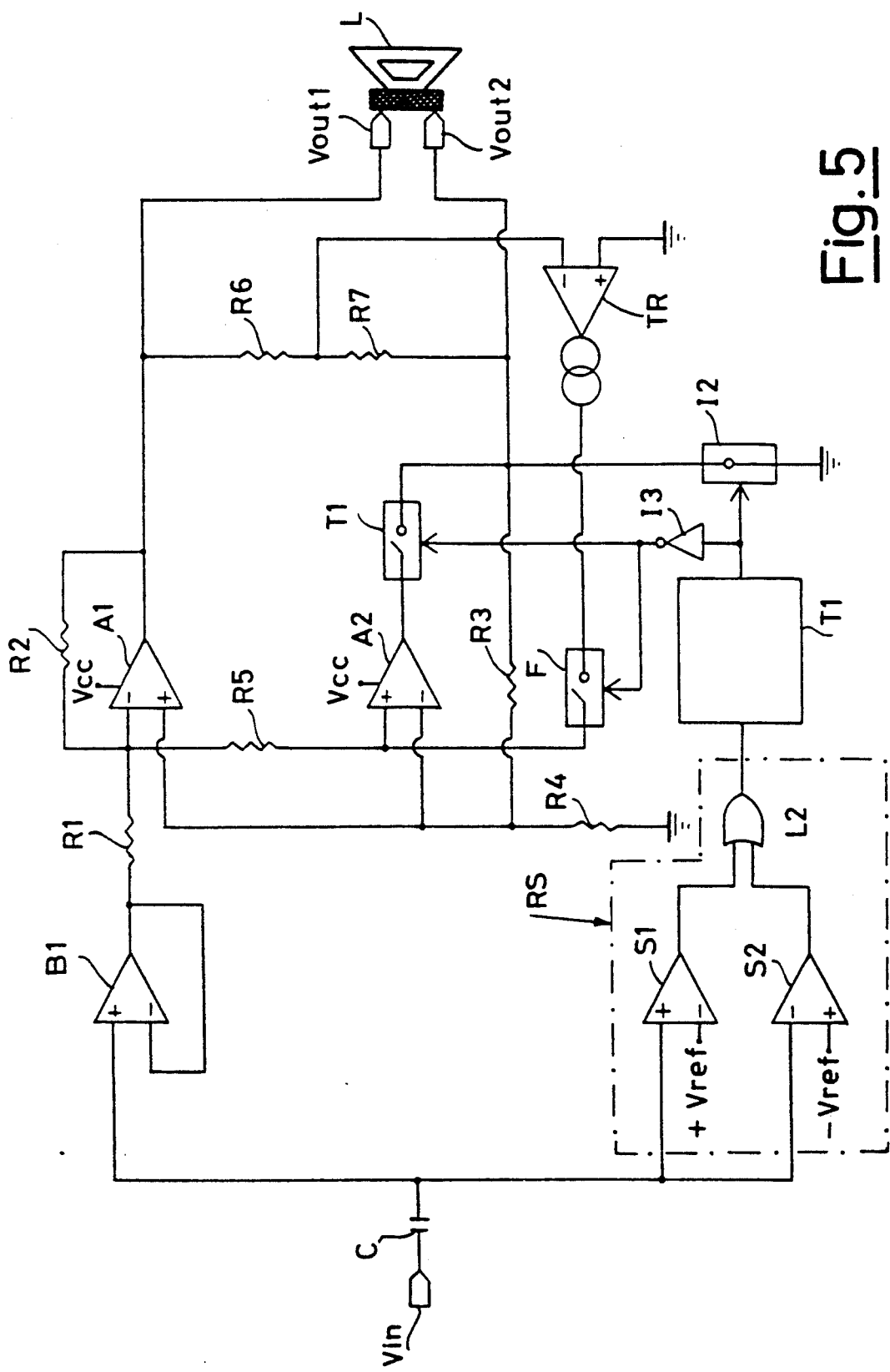
Figure 6:
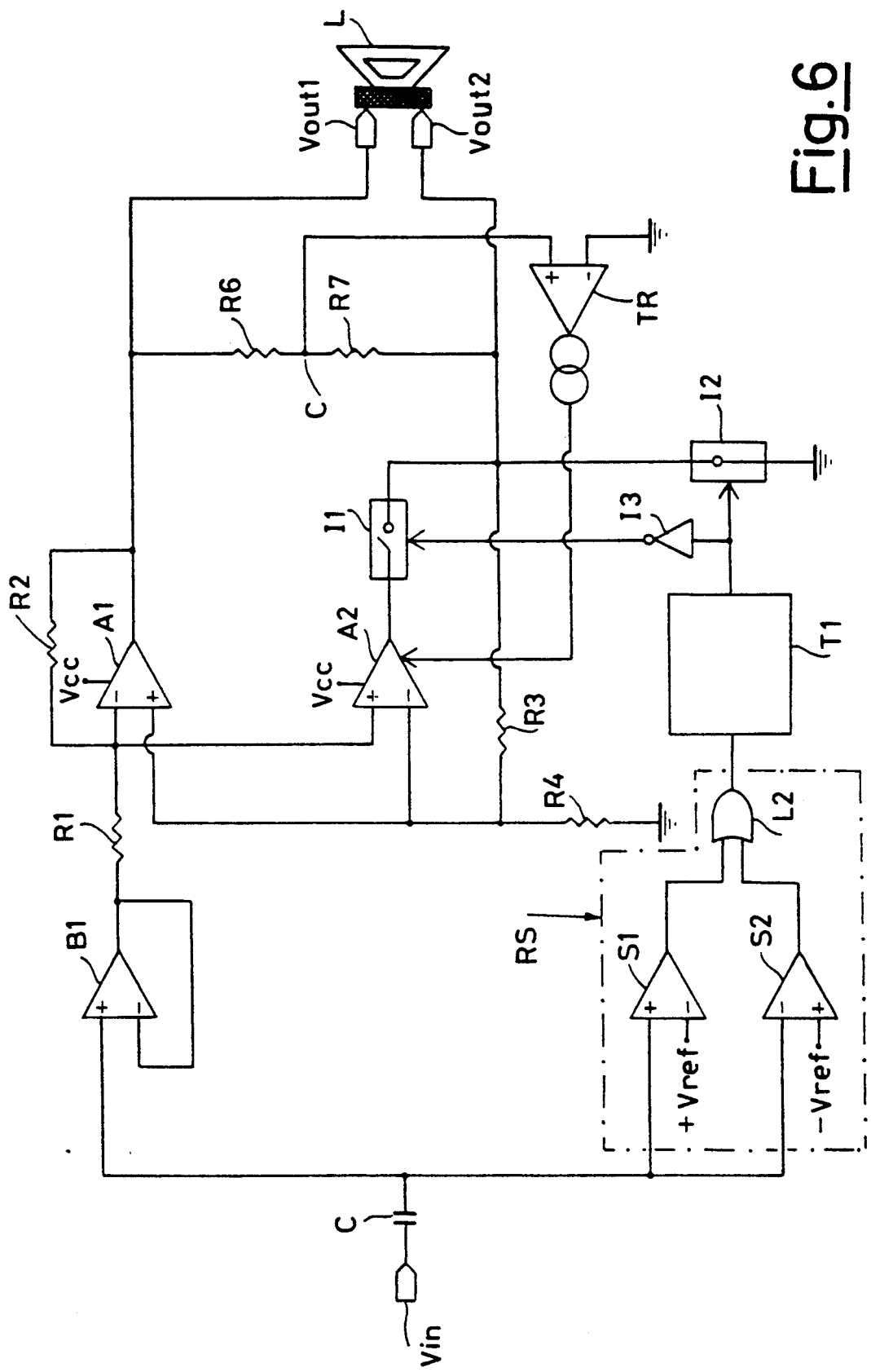

The features of this invention will become clearer from the embodiments illustrated by way of non-restrictive examples in the appended drawing, in which:

FIG. 1 illustrates a circuit diagram of a power amplifier according to the invention, FIGS. 2, 3 illustrate equivalent circuits to the amplifier in FIG. 1 in the case of single-ended and bridge operation, FIGS. 4, 5, 6 illustrate three possible variant embodiments of the circuit in FIG. 1 with a balanced load.

With reference to FIG. 1, two amplifier blocks A1 and A2 in class A-B with a single feed Vee and non-inverting and inverting inputs respectively connected together are driven by an input voltage Vin at their inverting and non-inverting inputs respectively, although connected together. Between the input for signal Vin and the inputs to amplifiers A1, A2 there is placed a series of a condenser C, decoupling buffer B1 and a resistance R1. The function of buffer B1 is to cancel out the effect of the series resistance of a non-ideal voltage generator Vin.

The output of amplifier A1 is connected to a terminal Vout1 of a load L whose other terminal Vout2 is connected to the output of amplifier A2 via a first switch I1 and earthed through a second switch I2. The purpose of the abovementioned switches will be specified later.

There are feedback resistances R2, R3 between terminal Vout1 of load L and the inverting input of amplifier A1 and between terminal Vout2 of load L and the inverting input of amplifier A2. The inverting input of amplifier A2 is also connected to earth through a resistance R4.

The amplifier in FIG. 1 also comprises a threshold detector block RS which comprises a first and a second amplifier block S1, S2 capable of receiving the input voltage Vin at its non-inverting and inverting inputs respectively, with reference voltages +Vref, −Vref respectively being present at the other inputs. In cascade with amplifiers S1, S2 there is an OR logic gate L2 whose output U1 indicates whether or not the absolute value of an input signal threshold Vin has been exceeded. In series with the threshold detecting block RS there is preferably a switching delay block T1 whose output directly controls switch I2 and switch I1 through an inverter I3. The function of block T1 is to delay switching of the amplifier from bridge to single-ended to avoid disturbances generated by the switching peaks.

The operation of the amplifier in FIG. 1 is as follows.

As long as the absolute value of the input signal Vin remains below a predetermined threshold, logic output U1 of threshold detector block RS causes switch I2 to close and switch I1 to open. Amplifier A2 is thus in a tri-state condition, that is non-conduction with a non-defined output. Amplifier A1 drives and the equivalent circuit of the amplifier is that shown in FIG. 2, corresponding to single-ended operation, where Rx indicates the earth resistance of switch I2 and RL indicates the load resistance. The load L is solely fed by voltage Vout1, while there is a voltage Vout2 of virtually zero on the other terminal.

In this case it can be seen by simple reckoning, not shown, that the amplifier gain, or the ratio between the voltage at the terminals of load L and the input voltage Vin, is independent of resistance Rx and solely depends on the ratio between resistances R2 and R1.

It is now assumed that the absolute value of the input signal Vin exceeds the predetermined switching threshold. Logic output U1 of threshold detector block RS then causes switch I2 to open and switch I1 to close. Under these conditions amplifier A2 will begin to conduct together with amplifier A1 and the equivalent circuit will be that shown in FIG. 3 corresponding to the condition of bridge operation.

In a wholly similar way to that described above it is possible by simple reckoning, not shown, to see that the amplifier gain solely depends on the ratio between resistances R2 and R1.

This operating condition will persist until the input signal Vin falls below the predetermined threshold and causes switching back to the state of single-ended operation. This switching back may take place with some delay introduced by block T1 so as to avoid any distortion produced by repeated switching.

In accordance with the variant illustrated in FIG. 4, a trans-conductance amplifier TR is provided and on the non-inverting input of this there is a voltage taken from a common node C between two resistances R6, R7 in parallel with load L whose inverting input is connected to earth. The output from amplifier TR is connected through a switch F controlled by the output of inverter I3 to the inverting input of amplifier A2 which is connected to the non-inverting input of amplifier A1 via a resistance R5.

In particular the function of transconductance amplifier TR is to balance the voltage on the load. Switch F in cascade therewith disconnects the output from amplifier TR if the amplifier operates in the single-ended condition, as in this case only the signal Vout1 should be present.

As illustrated in FIG. 5, as an alternative to that illustrated in FIG. 4, the output of amplifier TR may be connected via switch F to the non-inverting input of amplifier A2, which is connected to the inverting input of amplifier A1 through a resistance R5.

Finally, as illustrated in FIG. 6, the output from amplifier TR may be connected to an intermediate node of amplifier A2. This circuit arrangement is obviously the simplest because it does not require a switch F to be present.

We claim:

1. A high efficiency power audio amplifier with a single feed, comprising:
    a first and a second amplifier block that operate out of phase driven by a single input signal and having their outputs connected to two terminals of a load;
    circuit means to disable one of said amplifier blocks when the absolute value of the input signal is below a predetermined threshold level; and
    a passive feedback system capable of maintaining the amplifier gain constant when either one or two amplifier blocks are in operation located between said terminals of the load and the inputs of the first and second amplifier blocks.

2. An amplifier according to claim 1, characterised in that the said circuit means comprise a first switch placed between the output from the disabled amplifier block and the load, a second switch placed between the load and earth and a threshold detector block for the input signal which controls the closure/opening of the said first switch and the opening/closure of the said second switch depending on whether or not the absolute threshold value of an input signal has been exceeded.

3. An audio amplifier according to claim 2, characterised in that it comprises a delay block placed between the output of the threshold detector block and the switches to delay switching of the amplifier from operation with two amplifier blocks to operation with a single amplifier block.

4. An amplifier according to claim 1, characterised in that it comprises a transconductance amplifier whose non-inverting input is connected to a common node between a set of two resistances placed in parallel with the load and whose output is functionally connected to the record amplifier block so as to balance the voltage on the load when operating with two amplifier blocks.

5. An amplifier according to claim 1 characterized in that the first and second amplifier blocks operate in opposite phase from each other.

6. A high efficiency power audio amplifier comprising:
    a single input signal terminal;
    a first amplifier block and a second amplifier block coupled to the single input signal terminal to be driven by a single input signal and operating in opposite phase from each other;
    a load device having two terminals, a first terminal being connected to the first amplifier block and the second terminal being alternatively connectable to the second amplifier block or to a selected voltage potential other than the second amplifier block; and
    a switching circuit that disconnects the second terminal of the load from the second amplifier block and connects it to the selected voltage potential when the absolute value of the input signal is below a threshold level, but switching to connect the second terminal of the load to the second amplifier block and disconnected it from the selected voltage potential when the absolute value of the input signal is above the threshold level.

7. The amplifier according to claim 6 further including:
   a positive feedback system connected between the terminals of the load and the inputs to the first and second amplifier blocks that is capable of maintaining the amplifier gain constant to the load when either one or two amplifier blocks are operationally connected to the load.

8. The amplifier according to claim 6 further including:
   a threshold detector circuit connected to the input signal terminal for outputting a signal indicative of whether or not the threshold value of the input signal has been exceeded.

9. The amplifier according to claim 8 further including:
   a signal delay block coupled between the output of the threshold detector block and a switching circuit to delay switching of the connection of the second terminal of the load from being connected to the second amplifier to being switched to being connected to the selected voltage potential.

10. The amplifier according to claim 6 further including:
    a transconductance amplifier having its non-inverting input connected to a selected node placed in parallel with the load and having its output functionally connected to the second amplifier block so as to balance the voltage on the load when operating with both amplifier blocks simultaneously.

11. The audio amplifier according to claim 10 wherein the output of said transconductance amplifier is connectable to the inverting input of the second amplifier block; and
    a switch connected between the output of said transconductant amplifier and the inverting input of the second amplifier block, the switch being operated to connect the output of the transconductant amplifier to the inverting input of the second amplifier block when the second amplifier block is connected to the second terminal of the load, and to disconnect the output of the transconductance amplifier from the inverting input of the amplifier when the second amplifier block is not connected to the second terminal of the load.

12. The audio amplifier according to claim 10 wherein the output of said transconductance amplifier is connectable to the noninverting input of the second amplifier and to the inverting input of the first amplifier, the noninverting input of the second amplifier being connected to the inverting input of the first amplifier via a resistor; and
    a switch connected between the output of the transconductance amplifier and the inputs to the first and second amplifier blocks for alternatively connecting or disconnecting the output of the transconductance amplifier to the inputs of the first and second amplifier blocks.

13. The amplifier according to claim 10 wherein the output of the transconductance amplifier is connected to an intermediate node of the second amplifier.

14. A method of controlling the voltage applied across the load from a single input signal comprising:
    connecting a first terminal of a load having two terminals to a first amplifier block when the input signal is below a selected threshold value; and
    connecting the other terminal of the load to a selected voltage potential when the input signal is below a selected threshold value;
    disconnecting the second terminal of the load from the selected voltage potential when the input signal is above the selected voltage potential; and
    connecting the second terminal of the load to a second amplifier block when the input signal exceeds the selected threshold value.

15. The method according to claim 14 further including:
    sensing when the input signal exceeds the selected threshold value;
    switching the output of the second amplifier to be connected to the second terminal of the load upon the input signal exceeding the selected threshold value;
    sensing when the input signal transitions from above the selected threshold value to below the selected threshold value; and
    delaying the switching of disconnecting the output of the second amplifier to the second terminal of the load for a selected delay period to avoid distortion produced by repeated switching.

16. The method according to claim 14 further including switching the output of a transconductance amplifier to the inverting input of the second amplifier simultaneously with switching the output of the second amplifier to be connected to the second terminal of the load so as to balance the voltage on the load when operating with both the first and second amplifiers connected to the load.

17. The method according to claim 14 further including:
    connecting the output of a transconductance amplifier to an intermediate node of the second amplifier so as to balance the voltage on the load when operating with the first and second amplifiers connected to the load.

18. The method according to claim 14 further including:
    connecting the output of a transconductance amplifier to both the inverting input of the first amplifier and to the noninverting input of the second amplifier when the input signal exceeds the selected threshold voltage.

* * * * *

UNITED STATES PATENT AND TRADEMARK OFFICE
CERTIFICATE OF CORRECTION

PATENT NO. : 5,194,821
DATED : March 16, 1993
INVENTOR(S) : Davide Brambilla, Guido Brasca and Edoardo Botti It is certified that error appears in the above-indentified patent and that said Letters Patent is hereby corrected as shown below:

On the title page, second line of the title and column 1, line 2, delete "amplifiers" and substitute therefor --amplifier--.

On the title page, third line of the title and column 1, line 3, delete "amplifier" and substitute therefor --amplifiers--.

Signed and Sealed this

Fourth Day of January, 1994

Attest:

BRUCE LEHMAN

Attesting Officer     Commissioner of Patents and Trademarks